(12) United States Patent
Gerousis et al.

(10) Patent No.: US 8,863,048 B1
(45) Date of Patent: Oct. 14, 2014

(54) METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN

(71) Applicant: Cadence Design System, Inc., San Jose, CA (US)

(72) Inventors: Vassilios Gerousis, San Jose, CA (US); Shuo Zhang, Fremont, CA (US); Stefanus Mantik, San Jose, CA (US); Yuan Huang, Redwood City, CA (US); Jing Chen, Fremont, CA (US); Jianmin Li, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/840,259

(22) Filed: Mar. 15, 2013

(51) Int. Cl.
*G06F 17/50* (2006.01)

(52) U.S. Cl.
CPC .................. *G06F 17/5072* (2013.01)
USPC .............. 716/55; 716/100; 716/106; 716/118

(58) Field of Classification Search
CPC ............ G06F 17/5072; G06F 17/5077; G06F 17/5068; G11B 5/1272; G11B 5/17; G11B 5/3163; Y10S 706/921
USPC .................... 716/55, 100, 106, 118
See application file for complete search history.

(56) References Cited

U.S. PATENT DOCUMENTS

| | | | |
|---|---|---|---|
| 5,757,089 A * | 5/1998 | Ishizuka | 307/147 |
| 5,808,899 A * | 9/1998 | Scepanovic et al. | 716/123 |
| 5,837,557 A | 11/1998 | Fulford et al. | |
| 6,292,929 B2 * | 9/2001 | Scepanovic et al. | 716/118 |
| 7,197,738 B1 * | 3/2007 | Hetzel et al. | 716/126 |
| 7,280,945 B1 * | 10/2007 | Weiner et al. | 703/2 |
| 7,424,695 B2 * | 9/2008 | Tamura et al. | 716/130 |
| 7,691,549 B1 | 4/2010 | Glasser | |
| 7,721,243 B2 * | 5/2010 | Hetzel et al. | 716/126 |
| 8,341,586 B2 * | 12/2012 | Frankle et al. | 716/126 |
| 2001/0003843 A1 * | 6/2001 | Scepanovic et al. | 716/7 |
| 2009/0204930 A1 | 8/2009 | Cohn et al. | |
| 2010/0187658 A1 | 7/2010 | Wei | |
| 2013/0168827 A1 * | 7/2013 | Kodama et al. | 257/618 |
| 2013/0346937 A1 | 12/2013 | Kennedy et al. | |
| 2014/0038085 A1 | 2/2014 | Chern et al. | |

OTHER PUBLICATIONS

Korczynski et al., "Advanced Lithography is All about Materials" Mar. 2011.

(Continued)

*Primary Examiner* — Sun Lin
(74) *Attorney, Agent, or Firm* — Vista IP Law Group, LLP

(57) ABSTRACT

Disclosed are methods, systems, and articles of manufactures for implementing multiple-patterning-aware correct-by-construction layout processing for an electronic design by identifying rules for a first layer and for second layer(s) adjacent to the first layer, determining one or more sets of grids based on the rules, extending or implementing shapes to terminate at some grids of the one or more sets of grids, and populating the data of the ends of the shapes in the first layer in a data structure. The one or more sets of grids are in direction(s) perpendicular to the routing direction(s) of the first layer and have one or more grid pitches determined based at least in part upon routing pitch(es) of the second layer(s) and rule(s) for vias.

32 Claims, 17 Drawing Sheets

(56) References Cited

OTHER PUBLICATIONS

Altamirano-Sanchez et al., "Spacer Etch Process for Self-Aligned Double Patterning of 32nm Half-Pitch", 2009.
Chris Ngai, "Manufacturing Ready Self-Aligned Double Patterning for 3xnm Flash Production" May 2008.
Zhang et al., "Self-Aligned Double Patterning Decomposition for Overlay Minimization and Hot Spot Detection" Jun. 2011.
Dai et al., "Implementing Self-Aligned Double Patterning on Non-Gridded Design Layouts", 2009.
Zigang Xiao, "A Polynomial Time Exact Algorithm for Self-Aligned Double Patterning Layout Decomposition", Mar. 2012.
Paul Zimmerman, "Double patterning lithography: double the trouble or double the fun?" Jul. 2009.
Non-Final Office Action dated Feb. 28, 2014 for U.S. Appl. No. 13/840,717.
Non-Final Office Action dated Feb. 28, 2014 for U.S. Appl. No. 13/840,567.

* cited by examiner

METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN

CROSS REFERENCE TO RELATED APPLICATION(S)

This application is related to U.S. patent application Ser. No. 13/840,717 entitled "METHODS, SYSTEMS, AND ARTICLES OF MANUFACTURE FOR IMPLEMENTING CORRECT-BY-CONSTRUCTION PHYSICAL DESIGNS WITH MULTIPLE-PATTERNING-AWARENESS", and U.S. patent application Ser. No. 13/840,567, entitled "METHODS, SYSTEMS, AND ARTICLES OF MANUFACTURE FOR PERFORMING DESIGN RULE CHECK FOR ELECTRONIC DESIGNS", the content of both applications is hereby incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Multiple-patterning techniques, such as the sidewall image transfer techniques with two masks per metal layer, have been used to manufacture deep-submicron electronic designs. In typical multiple-patterning approaches, each metal layer is fabricated with multiple photolithographic masks. Using multiple core masks often give rise to systematic or non-systematic alignment or overlay issues between the multiple core masks. The recent development of the self-aligned double patterning (SADP) avoids such alignment or overlay issues by using a core mask and a trim mask (or block mask) for each layer to be printed on a lithographic system. Nonetheless, with the advent of 32 nanometer (32 nm) technology and beyond (e.g., 22 nm, 14 nm, 10 nm, etc.), the trim mask require its own design rules that are often merged with metal layout design rules. Moreover, the trim mask rules are often global in nature and thus pose significant difficulties in physical design implementation tools. For example, a typical line staggering rule may cover as many adjacent lines as possible, and thus modifying one line to obey this line staggering rule may affect the next line(s) or even lines that are distant from the line that is being modified. In addition, the trim mask rules are often directional in nature and depend upon how a mask feature is disposed on the trim mask relative to another mask feature.

In addition, traditional design rule checking is based on geometries or geometric shapes in a physical design of an electronic circuit. Nonetheless, as described earlier, the trim mask rules and requirements are often merged with the layout design rules yet are oftentimes global and directional in nature. Although nothing prevents the application of a traditional design rule checking to an electronic circuit design with 32 nm or beyond technology nodes, the search time and hence the amount of time required for traditional DRC is proportional to log (n) even if the search is done locally (e.g., within a confined region of a layout), where n denotes the number of shapes in the entire layout. Such a traditional DRC approach often requires several hours or even days to complete its execution, especially for a modern electronic circuit design having hundreds of millions or even billions of transistors.

Gridded physical implementation of electronic design has been widely used. Nonetheless, the traditional gridded physical implementation is not correct-by-construction and fails to accommodate the trim mask rules. In addition, conventional physical design approaches are usually dependent upon the total number of shapes in a physical design. In other words, the larger the electronic design is, the longer it takes these conventional physical design tools to perform their respective functions. Regarding multiple-patterning to achieve half-pitch sizes in modern electronics (e.g., designs with 14 nm or 10 nm technology nodes), some previous solutions utilize multiple core masks; and some other previous solutions utilize self-aligned double patterning techniques. Both approaches have their own respective disadvantages and do not accommodate the trim mask rules. For design rule checking, conventional DRC examines the shapes or geometries of a physical design, and the search time for each search of the conventional DRC is proportional to log(n), where n denotes the total number of shapes in the entire design.

Therefore, there is a need for implementing the multiple-patterning aware correct-by-construction routing solutions for an electronic design. More specifically, several embodiments of the invention accommodate such trim mask rules and enable the routing process to find legal paths with no design rule checking while transforming the global problem resulting from the global nature of the trim mask rules into a local problem for the routing process to identify legal paths for semiconductor technologies beyond the 32 nm technology. There is also a need for a new design rule check process and a new violation fixing process for electronic designs having advanced technology nodes such as the 10-nm nodes in modern electronics.

SUMMARY

Disclosed are methods, systems, and articles of manufactures for implementing multiple-patterning-aware correct-by-construction layout processing for an electronic design. Some embodiments construct multiple sets of grids for a layer in a physical design based at least in part upon various design rules or requirements. The multiple sets of grids include at least a first set of grids in a first direction for the layer and at least a second set of grids in a second direction for the layer. Physical design implementation tools may then utilize the one or more sets of grids to implement the physical design by enforcing that all interconnects on the multiple sets of grids to generate a correct-by-construction physical design. These multiple sets of grids are artificially created in a physical design to provide guidance for various electronic circuit design tools and do not represent any physical geometries in the physical design. The methodology may utilize the first set of grids to create at least a part of the physical design in some embodiments. For example, a routing tool may use the first set of grids to implement interconnects by requiring that all interconnects thus created must fall on the first set of grids, and that all interconnects must start and end on the second set of grids in these embodiments. It shall be noted that these multiple sets of grids are not randomly determined or by simply aligning to the manufacturing grids or some uniformly spaced routing tracks. In some embodiments, the first set of grids may be determined based at least in part on some design rules or requirements such as but not limited to the spacing rule, the minimum width rule, the rule controlling via sizes, requirements of whether or not bends in interconnects are permitted or prohibited, or some directional design rules such as the multi-patterning-aware trim mask rules, etc. In some embodiments, the second set of grids may be determined based at least in part upon some design rules or requirements such as the routing pitch or some cost-benefit analyses. For example, the second set of grids may be determined to have a pitch size an integral multiple of which is equal to the routing pitch in some embodiments. As some practical example, the pitch of the second set of grids may be ½, ⅓, ¼, etc. of the routing pitch. In some embodiments, the methodology may further construct a third set of grids in the second direction of the layer. In other words, the second set of grids and the third set of grids are in the same second direction for a layer. The third set of grids may be determined based at least in part upon some design rules or requirements such as but not limited to a cut enclosure rule, the offset between two adjacent layers, etc. The methodology may use the second set of grids and/or the third set of grids (if constructed) to determine at least partially whether an interconnect may start and end in some embodiments. For example, the methodology may enforce that all interconnects must start on the second set of grids and end on the third set of grids in some embodiments where the second and third set of grids are available. The methodology may further construct or update a light-weight data structure for storing the physical design. Various physical design tools may further leverage this light-weight data structure to further perform their intended functions. For example, rather than storing the geometries or polygonal shapes of an interconnect in a physical design database, the methodology may store, for example, the coordinates of the first line end of the interconnect, the coordinates of the second line end, and the "through-wire" attribute in the light-weight data structure to represent the interconnect in some embodiments. Unlike traditional approaches whose performance of certain functions (e.g., search or DRC check, etc.) is generally proportional to some functional form of the total number of shapes in a physical layout of an electronic design, physical design tools may utilize such a light-weight data structure to facilitate a more efficient performance of various intended functions of such various physical design tools, independent of the total number of shapes in an electronic design in some embodiments. In some embodiments, the performance of certain tasks with the present invention is no longer proportional to some functional form of the total number of shapes in a physical design. Rather, the physical design tools may achieve the same intended purposes (e.g., DRC check) within a constant time, regardless of the number of shapes in the physical design. In some embodiments where, in addition to the right-way tracks, wrong-way tracks are also permitted on a layer of a physical design, the methodology may augment the light-weight data structure to accommodate the bend(s) along an interconnect. In various embodiments, because these multiple grids are constructed with the design rules and requirements, physical design tools (e.g., a routing tool or a DRC tool) may use these multiple sets of grids to perform their respective, intended functions while ensuring that the physical design complies with such rules or requirements without having to check for compliance with such rules or requirements.

Some embodiments construct multiple sets of grids for a layer in a physical design based at least in part upon various design rules or requirements. The multiple sets of grids include at least a first set of grids in a first direction for the layer and at least a second set of grids in a second direction for the layer. Physical design implementation tools may then utilize the one or more sets of grids to implement the physical design by enforcing that all interconnects on the multiple sets of grids to generate a correct-by-construction physical design. Some embodiments utilize restrictor constraints on the correct-by-construction color aware routing methodology to determine the routing solutions while accommodating the trim mask rules. These embodiments transform the global problem resulting from the global nature of the trim mask rules into a local problem while accommodating the trim mask rules by utilizing one or more sets of grids and manipulating the routed wires with respect to the one or more sets of grids. The one or more sets of grids are used to determine where the wires end in a layout and are different from the routing grids that some routing engines typically use. Some other embodiments are directed at implementing a design rule check on an electronic circuit design. More particularly, the search process in the design rule check process no longer depends on the total number of shapes in the entire electronic design. In some embodiments, the newly devised design rule check employs a constant search time for each search, independent of the total number of shapes in the entire electronic design. In these embodiments, the newly devised design rule check process provides a constant time for design rule checking. The newly devised design rule check process also does not examine the shapes or geometries as a traditional design rule checking engine does. Rather, the newly devised design rule check process operates on a grid layout, which belongs to a higher abstraction level than a conventional physical layout storing shapes and geometries upon which conventional design rule checking engines operate. Some other embodiments are directed at implementing a violation fixing process for an electronic circuit design.

The one or more sets of grids may include a single set of grids that may be termed "the set of high end grids" in some embodiments. Some embodiments may have more than one set of grids. For example, some embodiments may employ both the set of high end grids as well as the set of low end grids on a single routing layer. It shall be noted that the one or more sets of grids are not randomly determined or by simply aligning to the manufacturing grids or some uniformly spaced routing tracks. Rather, one set of grids (e.g., the set of lower end grids) may be determined based at least in part upon one or more design rules such as but not limited to a cut enclosure rule for a via in some embodiments. In some embodiments, the one or more sets of grids may also be determined based at least on, for example but not limited to, the design rule controlling the routing pitch size. It shall be noted that a multiple (e.g., an integral multiple) of the grid pitch of a set of grids may be identical to the routing pitch in some embodiments. The finer the grid pitch is, the better resolution there will be, and the less space will be consumed by extending an interconnect to a grid line at the cost of increasing sizes of the data structure(s) to store the design information. Some embodiments may also determine at least some of the one or more sets of grids based at least in part upon an offset between two adjacent routing layers. Some embodiments determine the one or more sets of grids for a routing layer based at least in part upon both the pitch and the offset. In some embodiments, the one or more sets of grids for the routing engine may be the same as the one or more sets of grids for design rule checking engine. In some other embodiments, the one or more sets of grids for the routing engine may be different from the one or more sets of grids for design rule checking engine. For the routing engine, finer grids provide better resolution and finer adjustments for the routing engine to adjust certain interconnects, although at the expense of possibly larger data structure for storing the design information. For the design rule checking engine, finer grids may possibly (although not necessarily) lead to larger data structure for the design information and thus may lead to more expensive design rule checking process.

After the one or more sets of grids are determined or identified, the routing engine with the flexible coloring methodology may then route the features for a core mask and the trim mask and extend the line ends of wires to the appropriate, corresponding grids when these line ends do not fall on any of the one or more sets of grids. The appropriate grids will be determined based on how many sets of grids are used for routing. In some embodiments where only one set of grids is used, the routing engine may extend the line ends to the corresponding grids (e.g., the nearest grids). In some other embodiments where two sets of grids (e.g., high-end grids and low-end grids) are used, the routing engine may extend line ends on one end of the lines to the first set of grids and the line ends on the other end of the lines to the second set of grids. Because of the use of the flexible coloring methodology, the routing solution thus determined complies with the coloring requirements; moreover, the routing engine with the specially defined grids enable the system to find the routing solution that not only accommodates the layout design rules but also complies with the separate trim mask rules.

In some embodiments where the routing engine extends (or contracts) a line end of an interconnect to an appropriate grid in the one or more sets of grids, extending (or contracting) the line end may push (or pull) other circuit feature(s) further away (or closer to) the extended (or contracted) line end of the interconnect that is being manipulated. In some embodiments, the process of extending (or contracting) a line end of an interconnect may also reserve a space with a predetermined size, and the reserved space may further push (or pull) other circuit feature(s) further away (or closer to) the extended (or contracted) line end of the interconnect that is being manipulated. In addition or in the alternative, extending a line end of an interconnect may result in a short between the interconnect and another circuit feature(s). Some embodiments can also detect such a short.

BRIEF DESCRIPTION OF THE FIGURES

The drawings illustrate the design and utility of various embodiments. It should be noted that the figures are not drawn to scale and that elements of similar structures or functions are represented by like reference numerals throughout the figures. In order to better appreciate how to obtain the above-recited and other advantages and objects of various embodiments, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 3C-1 and 3C-2 jointly illustrate a simplified schematic representation of a self-aligned image transfer process in some embodiments.

DETAILED DESCRIPTION OF ILLUSTRATED EMBODIMENTS

Various embodiments are directed to a method, system, and computer program product for implementing multiple-patterning-aware correct-by-construction layout processing for an electronic design. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-7.

Figure 1:
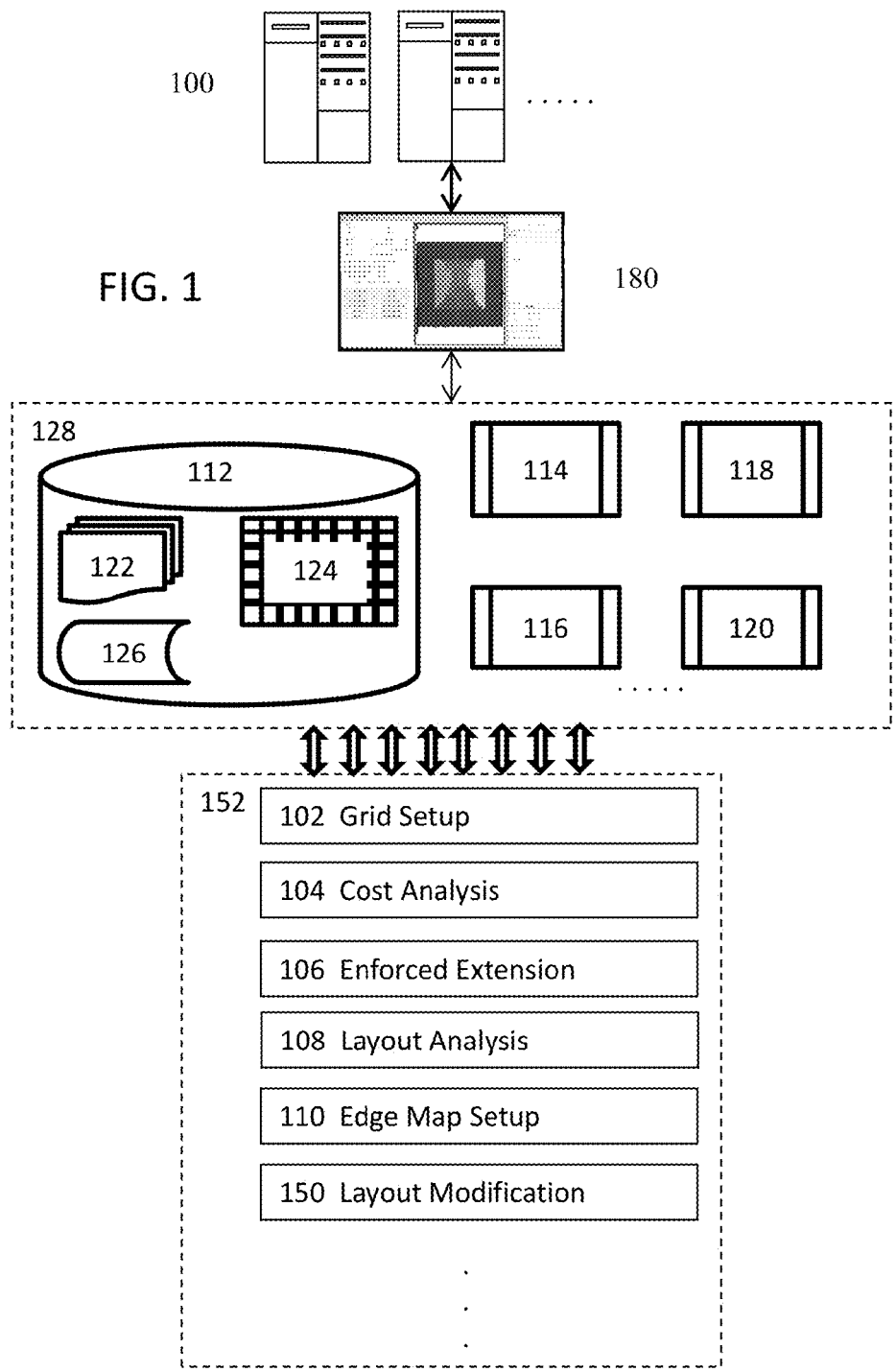
FIG. 1 illustrates a schematic representation of exemplary implementations for implementing multiple-patterning-aware correct-by-construction layout processing for an electronic design in some embodiments.

FIG. 1 illustrates a schematic representation of exemplary implementations for implementing multiple-patterning-aware correct-by-construction layout processing for an electronic design in some embodiments. In one or more embodiments, the system for implementing physical design decomposition with custom connectivity may comprise one or more computing systems 100, such as a general purpose computer described in the System Architecture Overview section to operate on an electronic design in a user interface 180 in order to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), edge map(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128, invoke various software, hardware modules, or a combination thereof 152 that may comprise a grid setup module 102 to determine various characteristics of and set up one or more sets of grids for a layer of an electronic design, cost analysis module 104 to perform one or more cost analyses to determine, for example, grid pitches or which grids are to be used by the enforced extension module for a specific shape in the design, a enforced extension module 106 to perform enforced extension for one or more shapes in a design, a layout analysis modules 108 to analyze a layout or design to identify various characteristics, parameters, etc. for one or more layers in the layout or design, an edge map set up module 110 to extract design data from a design and to populate one or more edge maps or data structures with extracted data, or a layout or design modification module 150 to modify a layout or design by, for example, using the enforced extension module 106.

Figure 2:
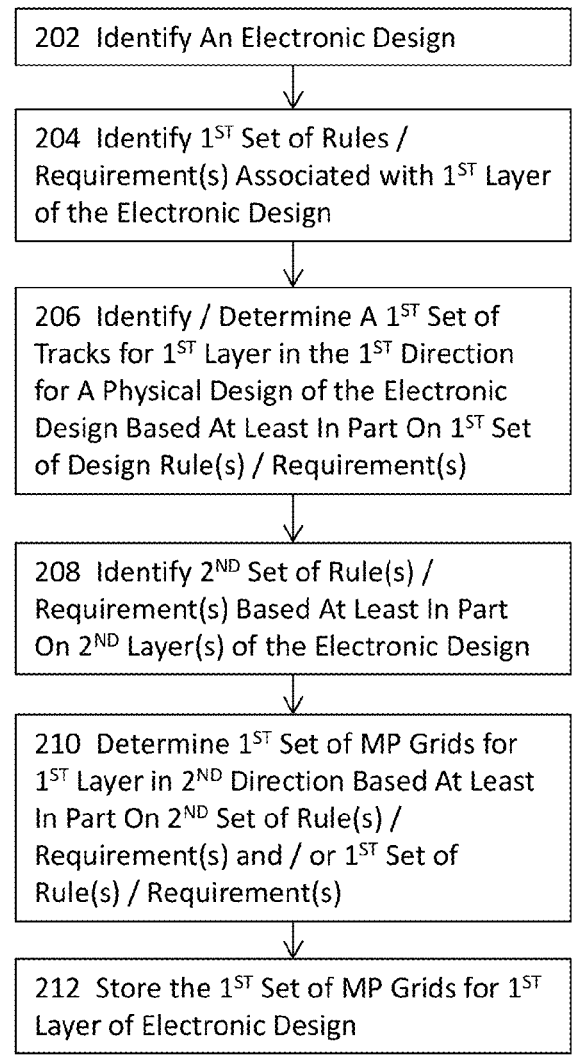
FIG. 2 illustrates a top level flow diagram for implementing multiple-patterning-aware correct-by-construction layout processing for an electronic design in some embodiments.

FIG. 2 illustrates a top level flow diagram for implementing multiple-patterning-aware correct-by-construction layout processing for an electronic design in some embodiments. In one or more embodiments, the method for implementing multiple-patterning-aware correct-by-construction layout processing for an electronic design illustrated in FIG. 2 may include the process 202 of identifying an electronic design. In some embodiments, process 202 identifies a layer of an electronic design, where the design for the layer may be complete, incomplete, or may even contain no design elements at all (an empty design space). In some embodiments where the layer is complete or incomplete yet includes some design elements, various embodiments may use various processes described herein to convert existing design elements and to add new design elements to complete processing the design for the layer of the electronic design. In some embodiments where the layer does not include any design elements, various embodiments may start anew and use various processes described herein to implement new design elements to generate the design for the layer of the electronic design. In some embodiments, the method may include process 204 of identifying a first set of one or more rules, constraints, or requirements (hereinafter rules) associated with the first layer of the electronic design. In some embodiments, a layer includes a routing layer or a metal layer on which interconnects or wires in one or both routing directions may be used. In some embodiments, the first set of one or more rules may include, for example but not limited to, one or more design rules, the routing pitch for a routing layer. In addition or in the alternative, the first set of one or more rules may include, for example, the size of technology nodes, one or more routing pitch rules such as a rule that requires the routing pitch is to be the integral multiple of the grid pitch, the routing pitch(es) for adjacent routing layer(s), via cut size rule, via cut enclosure rule, one or more design rules, or one or more trim mask (block mask) rules, or combinations thereof, etc.

In some embodiments, the method may include process 206 of identifying or determining a first set of tracks for the first layer in the first direction for a physical design of the electronic design based at least in part on the first set of one or more rules. In some embodiments, the first set of tracks include a set of routing tracks. In some embodiments, the first direction comprises the preferred routing direction for the first layer. For example, process 206 may use the routing pitch identified at 204 to identify or determine the first set of routing tracks for the first layer of the electronic design. In various embodiments, a routing track comprises an imaginary line that is used by physical design implementation tools (e.g., a router) to lay out the center of a via or the centerline of an interconnect or wire (hereinafter interconnect). A set of routing tracks includes a plurality of such tracks that are parallel to each other with the routing pitch as the spacing between two adjacent tracks. A routing layer may include one or more sets of routing tracks, each having the same or a different routing pitch in some embodiments. Therefore, routing tracks on a single routing layer may have uniform or non-uniform routing pitch.

In some embodiments, the method may include process 208 of identifying a second set of one or more rules based at least in part on one or more characteristics of one or more second layers of the electronic design. In some embodiments, a second layer includes a routing layer or a metal layer on which interconnects or wires in one or both routing directions may be used. In some embodiments, the second layer is situated immediately above or immediately below the first layer. In some embodiments, process 208 identifies the second set of rules based at least in part upon both the layer immediately above the first layer and the layer immediately below the first layer. In some embodiments, the second set of one or more rules include, for example but not limited to, the routing pitch(es) for the routing tracks on the second layer(s), via cut size rule, via cut enclosure rule, one or more design rules, or one or more trim mask (block mask) rules, or combinations thereof, etc. It shall be noted that the term "trim mask" and the term "block mask" are used interchangeably throughout the application.

In some embodiments, the method may include process 210 of determining a first set of multiple-exposure (MP) grids for the first layer in a second direction based at least in part on the second set of one or more rules and/or the first set of one or more rules. In some embodiments, process 210 determines the first set of MP grids based on the rule(s) of the second layer(s) so that the first set of MP grids may be used to terminate a line end of an interconnect as described in subsequent paragraphs. In some embodiments, the first set of grids is used for multiple patterning or multiple exposure lithography processes, such as a self-aligned double patterning lithography process. For example, process 210 may determine the first set of grids for the first layer by using at least the routing pitch of one adjacent routing layer and a rule that requires the routing pitch of the adjacent routing layer be an integral multiple of the grid pitch of the first set of grids in some embodiments. For example, if the routing pitch is 120-nm for metal layer 2 (M2), process 210 may determine that the grid pitch of the first set of grids to be 60-nm for the first metal layer (M1) such that the routing pitch of M2 (120-nm) is twice the grid pitch (60-nm) for the first set of grids in some embodiments. In this example, the process may thus determine the first set of grids with the grid pitch. In some embodiments, the process 210 may also determine the first set of grids for the first layer by using the via cut size rule and the via cut enclosure rule of an adjacent layer to determine the offset of the first set of grids and using the routing pitch of the adjacent routing layer to determine the grid pitch of the first set of grids on the first layer. As another example where the first routing layer is sandwiched between the third routing layer (M3) having 80-nm routing pitch and the second routing layer having 120-nm routing pitch, process 210 may determine the grid pitch for the first set of grids on the first layer to be 40-nm such that the M3 routing pitch (80-nm) is twice the grid pitch (40-nm), and that the M2 routing pitch (120-nm) is three times the grid pitch (40-nm). In this example, process 210 uses the greatest common divisor (GCD) or a common divisor of the routing pitches of adjacent layers as the grid pitch in some embodiments. More details about the offset and the relationship between the routing pitch and the grid pitch will be provided in subsequent paragraphs. In some embodiments where the adjacent routing layers have non-uniform routing pitches, the first set of grids may also have multiple grid pitches that are determined based at least in part upon the non-uniform routing pitches of the adjacent routing layers.

In some embodiments, the method may include process 212 of storing the first set of grids for the first routing layer of electronic design or using the first set of tracks and the first set of grids to implement or improve a physical design of the electronic design.

Figure 2A:
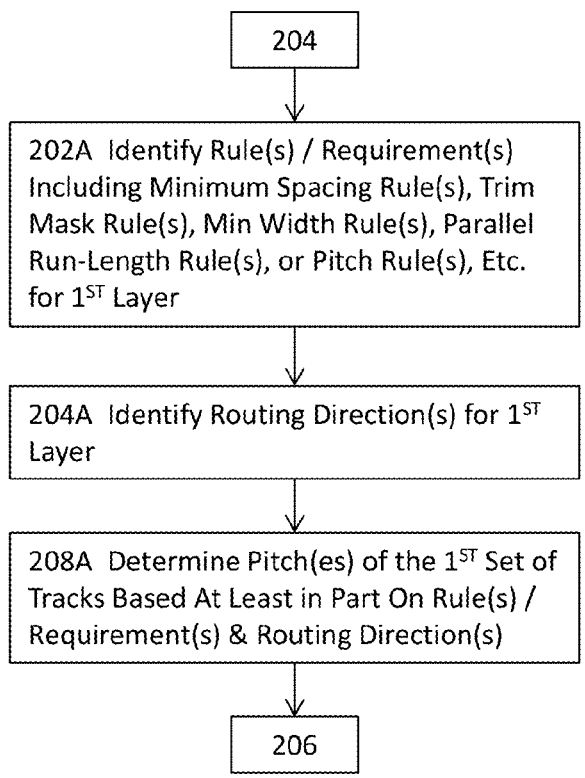
FIG. 2A illustrates more details for the flow diagram of FIG. 2 in some embodiments.

FIG. 2A illustrates more details for the flow diagram of FIG. 2 in some embodiments. More specifically, FIG. 2A illustrates more details about the method including process 204 and process 206 of FIG. 2. In some embodiments, process 204 may comprise the process 202A of identifying one or more rules for the first layer. In some embodiments, the one or more rules include, for example but not limited to, one or more minimum spacing rules, one or more trim mask rules, one or more core mask rules (e.g., a sidewall adjacency rule, minimum corner-to-corner rule, minimum spacing rule, or the minimum width rule, etc.), one or more min width rules, one or more parallel run-length rules, one or more pitch rules, any combinations thereof, etc. for the first layer. In some embodiments illustrated in FIG. 2A, the one or more rules identified at 202A are to be used or enforced by the physical implementation tools to determine the grid pitch of the first set of grids such that interconnects automatically obey these rules as the interconnects are being constructed by the physical implementation rules.

In some embodiments, process 204 may comprise the process 204A of identifying one or more routing directions for the first layer. In various embodiments, the direction of the first set of grids of a layer is perpendicular to the routing direction of the same layer. Therefore, the identification of the routing direction of one layer at 204A will be used to determine the direction of the first set of grids for the same layer.

In some embodiments, process 204 may comprise the process 206A of identifying or determining one or more routing pitches of the first set of tracks based at least in part on the one or more rules and the one or more routing directions of the first layer. The process illustrated in FIG. 2 may then proceed to 206.

Figure 2B:
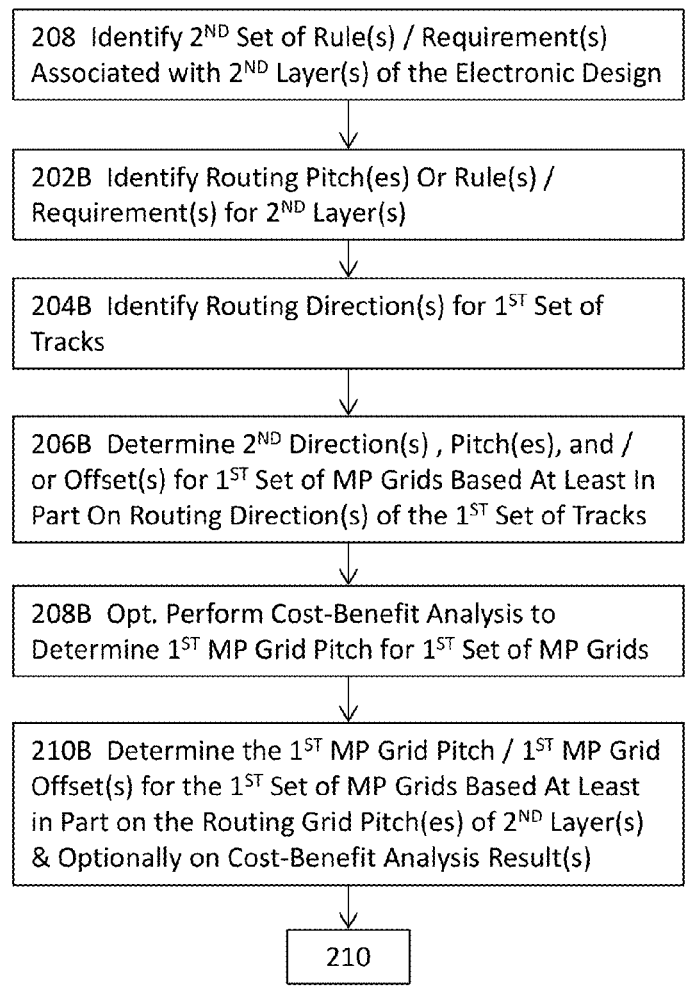
FIG. 2B illustrates more details for the flow diagram of FIG. 2 in some embodiments.

FIG. 2B illustrates more details for the flow diagram of FIG. 2 in some embodiments. More specifically, FIG. 2B illustrates more details about process 208 of FIG. 2. In some embodiments, process 208 may include the process 202B of identifying one or more routing pitches or one or more rules for one or more second layers adjacent to the first layer. As described in FIG. 2, an integral multiple of the grid pitch of a layer is equal to the routing pitches of the adjacent layers of the layer. Therefore, process 202B may identify one or more routing pitches for one or both adjacent layers such that the one or more routing pitches may be used later to determine the grid pitch(es).

In some embodiments, process 208 may include the process 204B of identifying one or more routing directions for the first set of tracks. In some embodiments where only the right-way tracks are permitted for a routing layer, process 204B identifies a single routing direction (e.g., the preferred routing direction) for the first set of tracks. In some embodiments where both the right-way tracks and the wrong-way tracks are permitted for a routing layer, process 204B may identify both routing directions (e.g., both the preferred routing direction and non-preferred routing direction) for the first set of tracks.

In some embodiments, process 208 may include the process 206B of determining one or more second directions, one or more pitches, and/or one or more offsets for the first set of grids based at least in part on the one or more routing directions of the first set of tracks. As presented above in the description of FIG. 2, a routing layer may include routing tracks in a first routing direction with a uniform routing pitch or with non-uniform routing pitches; the direction of a set of MP grids for a set of routing tracks is perpendicular to a routing direction of the set of routing tracks; and a routing pitch of a set of tracks is equal to an integral multiple of a grid pitch. Therefore, process 206B may determine a set of grids with a grid pitch in a direction perpendicular to a routing direction for a set of routing tracks with the routing direction and a routing pitch.

In some embodiments, process 208 may optionally include the process 208B of performing a cost-benefit analysis to determine the first grid pitch for the first set of grids. In some embodiments, process 208B may perform a cost-benefit analysis to determine the first grid pitch for the first set of grids based at least in part on the first routing pitch. For example, process 208B may perform a cost-benefit analysis to determine how fine or how coarse the grid pitch is, and how the grid pitch is affecting one or more subsequent processes or operations (e.g., design rule checking (DRC) or searches) performed on the physical design with the first set of grids. In this example, the first set of grids with finer pitch provides better resolution but may result in larger data structure(s) for storing the design because of the increasing number of points at the grid lines due to the finer grids. Depending on the algorithms used for, for example, a DRC process, the cost for searching or checking a particular design with such finer grids may increase. Therefore, in some embodiments, process 208B determines the first grid pitch for the first set of grids based at least in part upon the results of the cost-benefit analysis (or analyses).

In some embodiments, process 208 may include the process 210B of determining the first grid pitch or the first grid offset for the first set of grids. In some embodiments, process 210B determines the first grid pitch or the first grid offsets for the first set of grids based at least in part on the routing grid pitch(es) of the one or more adjacent second layers. In addition or in the alternative, process 210B determines the first grid pitch or the first grid offsets for the first set of grids based at least in part on some cost-benefit analysis results. In some embodiments where a single layer exhibits multiple routing pitches, process 210B may determine multiple grid pitches and multiple grid offsets for the first set of grids accordingly. In some embodiments, process 2108 may identify the first grid pitch based at least in part upon, for example but not limited to, simulations, heuristics, historical design data of similar designs, etc.

Figure 2C:
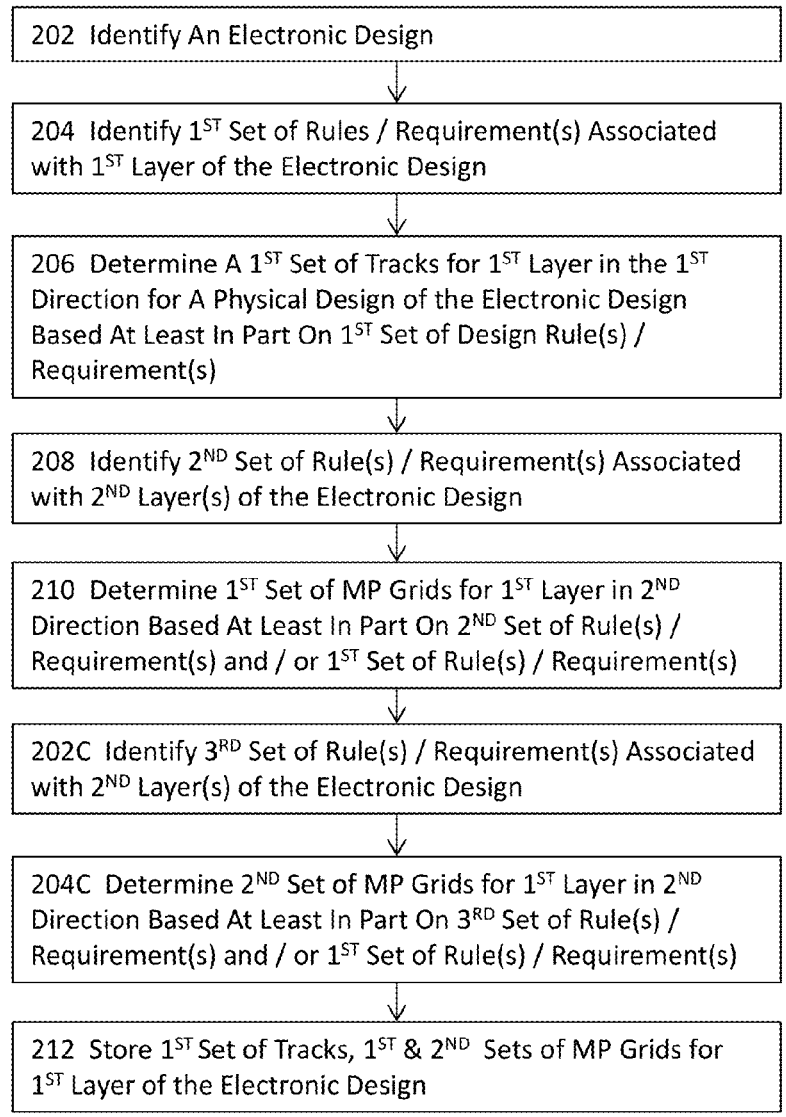
FIG. 2C illustrates a more detailed flow diagram for implementing multiple-patterning-aware correct-by-construction layout processing for an electronic design in some embodiments.

FIG. 2C illustrates a more detailed flow diagram for implementing multiple-patterning-aware correct-by-construction layout processing for an electronic design in some embodiments. In some embodiments, the method illustrated in FIG. 2C may comprise the process 202, 204, 206, 208, and 210 in substantial similar manners as those described for FIG. 2 above. In some embodiments, the method illustrated in FIG. 2C may further comprise the process 202C of identifying a third set of one or more rules that are associated with the one or more second layers adjacent to the first layer of the electronic design. In some embodiments, the third set of one or more rules include, for example but not limited to, a via cut size rule, a via cut enclosure rule, routing pitch(es) of adjacent layer(s), etc.

In some embodiments, the method illustrated in FIG. 2C may further comprise the process 204C of determining a second set of grids for the first layer in the second direction based at least in part on the third set of one or more rules and/or the first set of one or more rules. For example, if the first layer allows for only the horizontal routing direction in which all interconnects contain only horizontal segments of wires, the method illustrated in FIGS. 2 and 2C may determine the first set of grids for the interconnects that end to the right (high line-end) of their respective starting points. Process 204C may then identify the second set of grids for interconnects that end to the left (low line-end) of their respective starting points. The use and advantages of having both the first set of grids and the second set of grids will be described in subsequent paragraphs with reference to corresponding drawing figures.

Figure 2D:
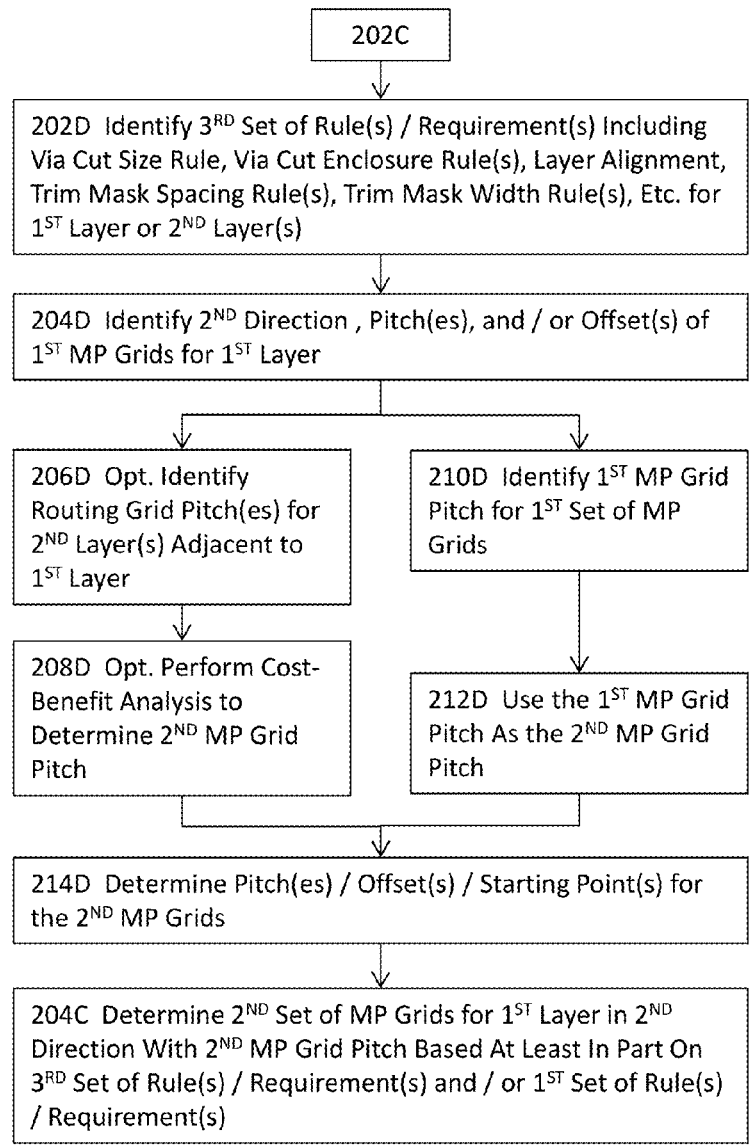
FIG. 2D illustrates more details for the flow diagram of FIG. 2C in some embodiments.

FIG. 2D illustrates more details for the flow diagram of FIG. 2C in some embodiments. More specifically, FIG. 2D illustrates more details of the method illustrated in FIG. 2C. In some embodiments, the method may include the process 202D of identifying the third set of one or more rules. In some embodiments, the third set of one or more rules may include, for example but not limited to, the via cut size rule(s), the via cut enclosure rule(s), the routing layer alignment rule that specifies whether two adjacent routing layers are aligned or are offset at a fixed distance in a direction, the trim mask spacing rule(s), the trim mask width rule(s), etc. for the first layer or the one or more second layers.

In some embodiments, the method may include the process 204D of identifying the second grid direction, one or more grid pitch(es), and/or one or more offsets of the first set of grids for the first layer. In some embodiments where the Manhattan routing grids are used, the second direction is perpendicular to the first grid direction which is perpendicular to the first routing direction of the first layer. As presented in previous paragraphs, a set of MP grids may have one or more grid pitches because a layer may have routing tracks with non-uniform routing pitches. The method may then bifurcate to 206D and 210D after 204D.

In some embodiments, the method may optionally include the process 206D of identifying one or more routing pitches for each of one or more second layers that are adjacent to the first layer. A single metal layer may have one or two adjacent layers depending on where the single metal layer is situated in the stack of layers in an electronic design. For example, M1 has only one adjacent routing layer—M2, whereas M2 has two adjacent routing layers—M1 and M3. Because a routing layer may have a uniform routing pitch across the entire layer or non-uniform routing pitches, process 206D may thus identify one or more routing pitches for a second layer adjacent to the first layer.

In some embodiments, the method may optionally include the process 208D of performing a cost-benefit analysis to determine the second grid pitch for the second set of grids in a substantially similar manner as that described for 208B.

In some embodiments, the method may include the process 210D of identifying the first grid pitch for the first set of grids.

In some embodiments, the method may include the process 212D of using the first grid pitch of the first set of grids as the second grid pitch for the second set of grids.

In some embodiments, the method may include the process 214D of determining one or more grid pitches, one or more offsets, or one or more starting points for the second set of grids.

In some embodiments, the method proceed to process 214D to determine the second set of grids for the first layer in the second direction with the second grid pitch based at least in part on the third set of one or more rules and/or the first set of one or more rules. In some embodiments, the second set of grids may be called the set of low-end grids In some embodiments, the method may then proceed to 212 to store the first set of tracks, the first and the second sets of grids for the first layer of the electronic design.

Figure 3A:
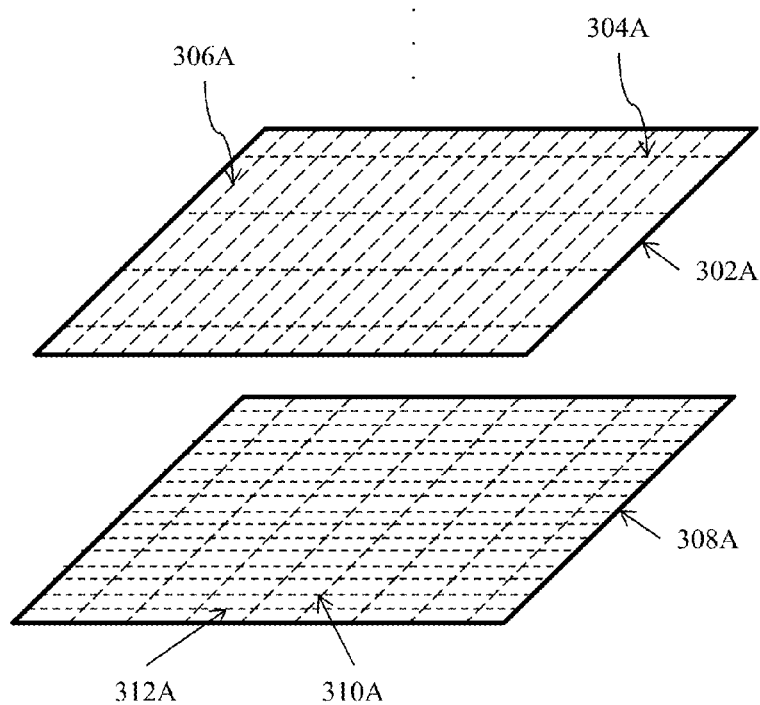
FIG. 3A illustrates an exemplary of routing tracks and a set of multi-exposure grids for each metal layer in some embodiments.

FIG. 3A illustrates an exemplary of routing tracks and a set of multi-exposure grids for each metal layer in some embodiments. More specifically, FIG. 3A illustrates two routing layers—metal 1 (M1) 308A and metal 2 (M2) 302A. Metal 1 routing layer 308A may have a set of routing tracks 310A in a first direction having uniform or non-uniform routing pitches. Metal 1 routing layer 308A may also have a set of grids 312A in a second direction. In some embodiments where the Manhattan routing grids are used, the second direction is perpendicular to the first direction. Metal 2 routing layer 302A includes a set of routing tracks 304A with uniform or non-uniform routing pitches in the second direction and a set of grids 306A in the first direction. In these embodiments illustrated in FIG. 3A, the routing tracks and the MP grids are always in two different routing directions on each layer.

Figure 3B:
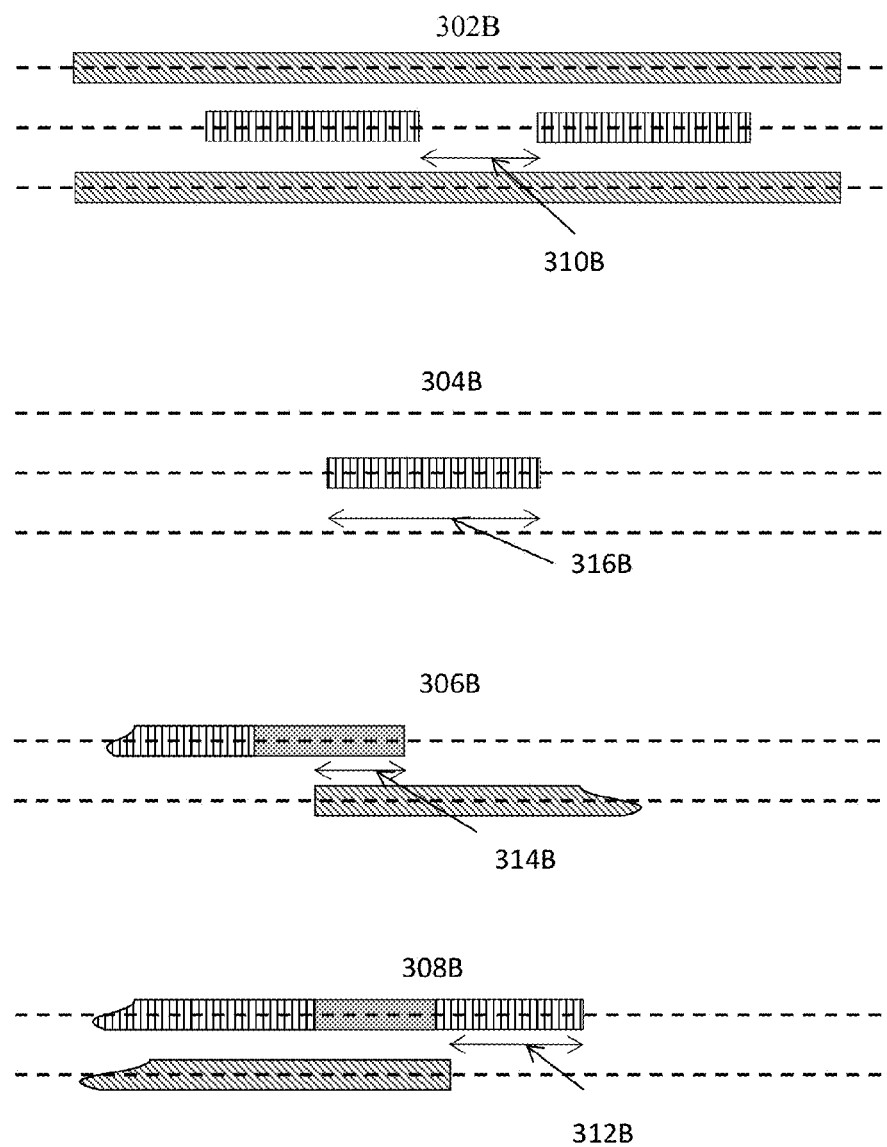
FIG. 3B illustrates some exemplary multi-exposure trim mask rules in some embodiments.

FIG. 3B illustrates some exemplary multi-exposure trim mask rules in some embodiments. 302B illustrates the trim mask minimum width rule where 310B represents the minimum spacing between two interconnects. 304B illustrates the minimum area rule that requires a minimum length 316B for a shape. For interconnects in advanced technology nodes, the area of one of the shapes is proportion to its length. Therefore, the minimum area rule imposes a minimum length for each interconnect. 306B represents the trim mask spacing rule that requires two neighboring interconnects running in opposite direction to have a minimum overlapping distance 314B. 308B represents the trim mask minimum step rule that requires two neighboring interconnects running in the same direction to have a step having a minimum step of 312B.

Figures 1, 3C:
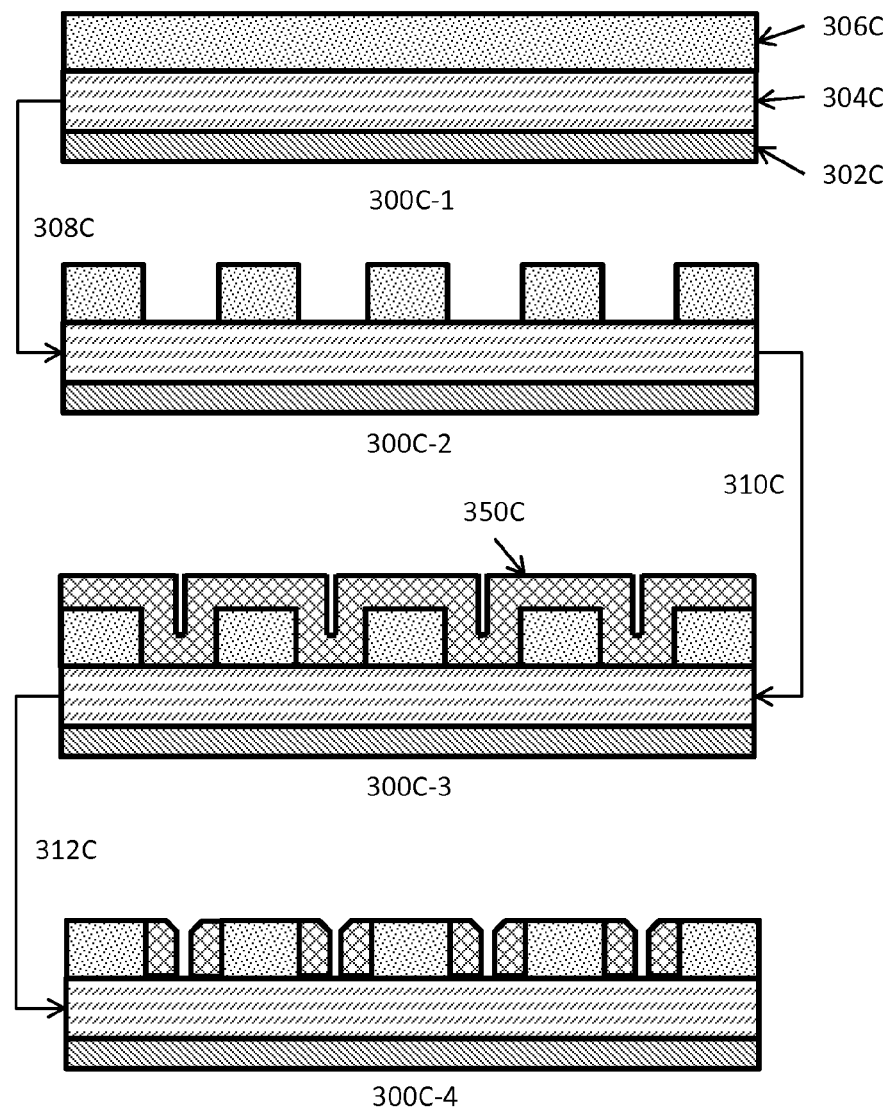
Figures 2, 3C:
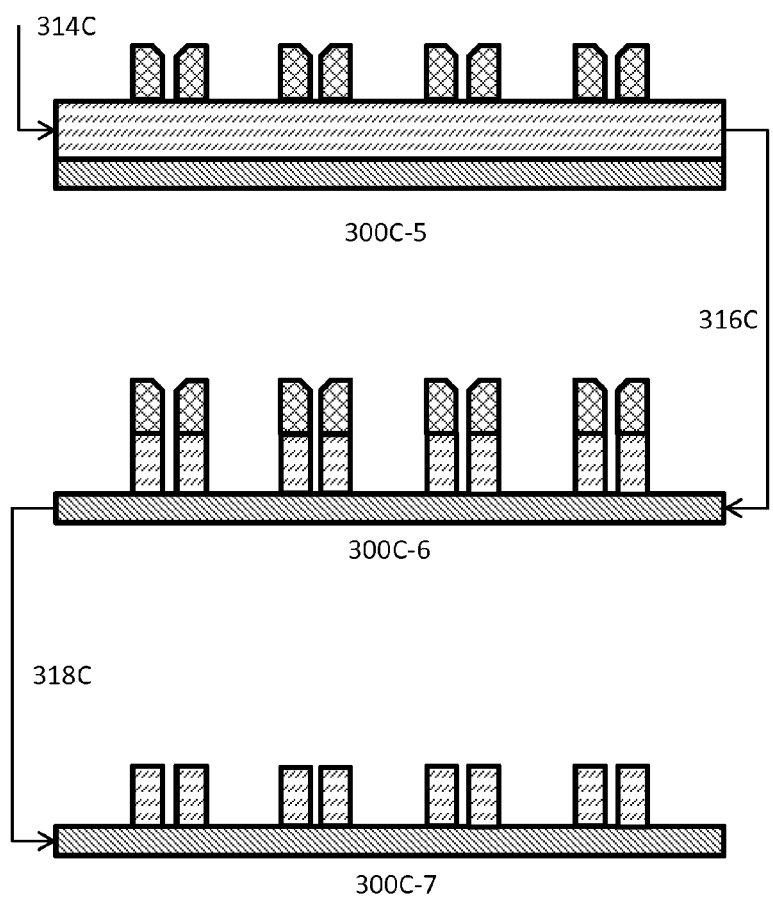

FIGS. 3C-1 and 3C-2 jointly illustrate a simplified schematic representation of a self-aligned image transfer process in some embodiments. The schematic representation of the process starts with a stack of three layers 300C-1—substrate 302C followed by the deposited hard mask etch layer in, for example, poly-silicon 304C with the photo resist 306C on top. 308C represents a core lithography process to form 300C-2 in which the photo resist 306C is exposed to form the particular pattern as shown in 300C-2. The stack 300C-2 then undergoes a spacer deposition process 310C to form the spacer 350C on top of the patterned photo resist 306C in 300C-2. A spacer comprises a film layer formed on the sidewall of a pre-patterned feature (e.g., the photo resist feature in 300C-2 formed by the core lithography exposure). The SADP process then uses the trim mask for trimming the spacer. A resulting stack is then shown in 300C-3 which is subsequently processed by an etching process 312C to form the stack 300C-4 where the spacer 350C above the photo resist 306C is etched away. Because there are two spacers for each feature in the photo resist, the density of features may thus be doubled, or the pitch may be halved with the use of spacers. The stack 300C-4 then undergoes the spacer sidewall formation process 314C to form the stack 300C-5 where the photo resist 306C in 300C-4 is removed. Stack 300C-5 is then processed with another etching step to pattern the hard mask etch layer 304C to form the patterned stack 300C-6 that is further processed by a positive tone spacer removal etching process to form the final pattern of the hard mask illustrated in stack 300C-7.

Figure 4:
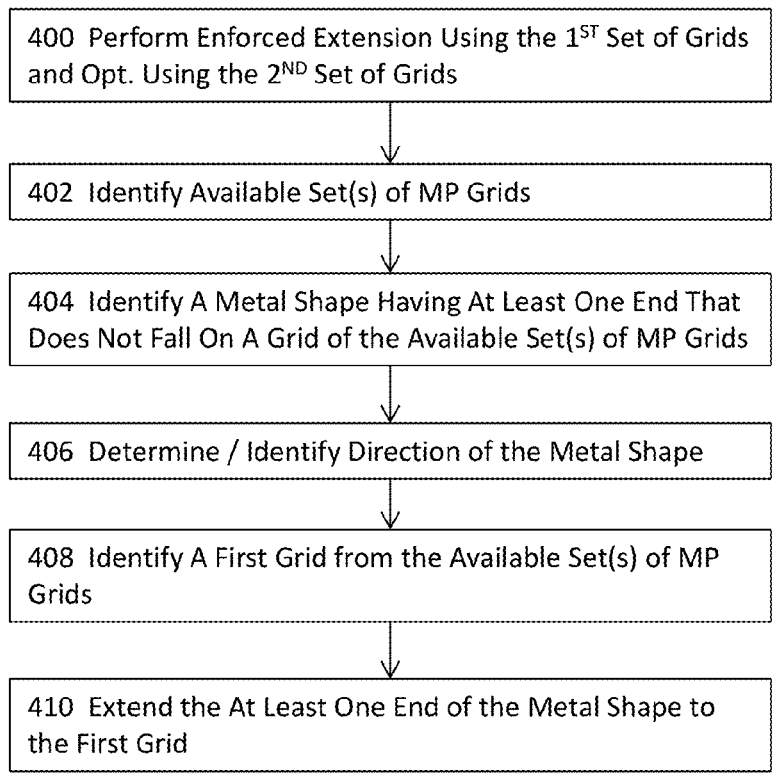
FIG. 4 illustrates a top level flow diagram for implementing multiple-patterning-aware correct-by-construction layout processing for an electronic design in some embodiments.

FIG. 4 illustrates a top level flow diagram for implementing multiple-patterning-aware correct-by-construction layout processing for an electronic design in some embodiments. More specifically, FIG. 4 illustrates a method 400 for performing enforced extension of interconnects using the first set of grids in some embodiments. In some of these embodiments, the method 400 may perform enforced extension using the first set of grids and optionally using the second set of grids. In one or more embodiments, the method 400 illustrated in FIG. 4 comprises the process 402 of identifying available sets of grids. In some embodiments where only the first set of MP grids (high grids) is available, process 402 identifies the first set of grids. In some embodiments where both the first set of MP grids (high grids) and the second set of MP grids (low grids) are available, process 402 may identify the high grids, the low grids, or both. In some embodiments, the method 400 may include the process 404 of identifying a metal shape (e.g., an interconnect) that has at least one end that does not fall on a grid of the identified set(s) of grids. For example, process 404 may identify a wire having one line end that does not fall on any grid of the available sets of grids identified at 402.

In some embodiments, the method 400 may include the process 406 of determining or identifying the direction or orientation of the metal shape. For example, process 406 may identify that the interconnect identified at 404 terminates to the right (or left, above, or below) of the starting point of the interconnect.

In some embodiments, the method 400 may include the process 408 of identifying a first grid from the available sets of grids identified at 404. For example, process 408 may identify the next closest grid from a set of grids identified at 404. In these embodiments, the next closest grid is identified at 408 to minimize extension and hence to minimize wire length where the metal shape constitutes an interconnect.

In some embodiments, the method 400 may include the process 410 of extending at least one end of the metal shape to the grid identified at 408. In the example for 406 above, process 410 may extend the interconnect to the right so that the interconnect terminates at the identified grid identified at 408. It shall be noted that the method or some other processes (e.g., a design rule check process) may further check to determine whether the metal shape (now extending to the identified grid) satisfies one or more design rules, requirements, or constraints (collectively "design rules"). If the method or these processes determines that the extended metal shape fails to meet one or more design rules, process 410 may extend at least one end of the metal shape to the next closest grid in the identified sets of grids. In these embodiments, the next closest grid is identified at 408 to minimize extension and hence to minimize wire length where the metal shape constitutes an interconnect.

Figure 5:
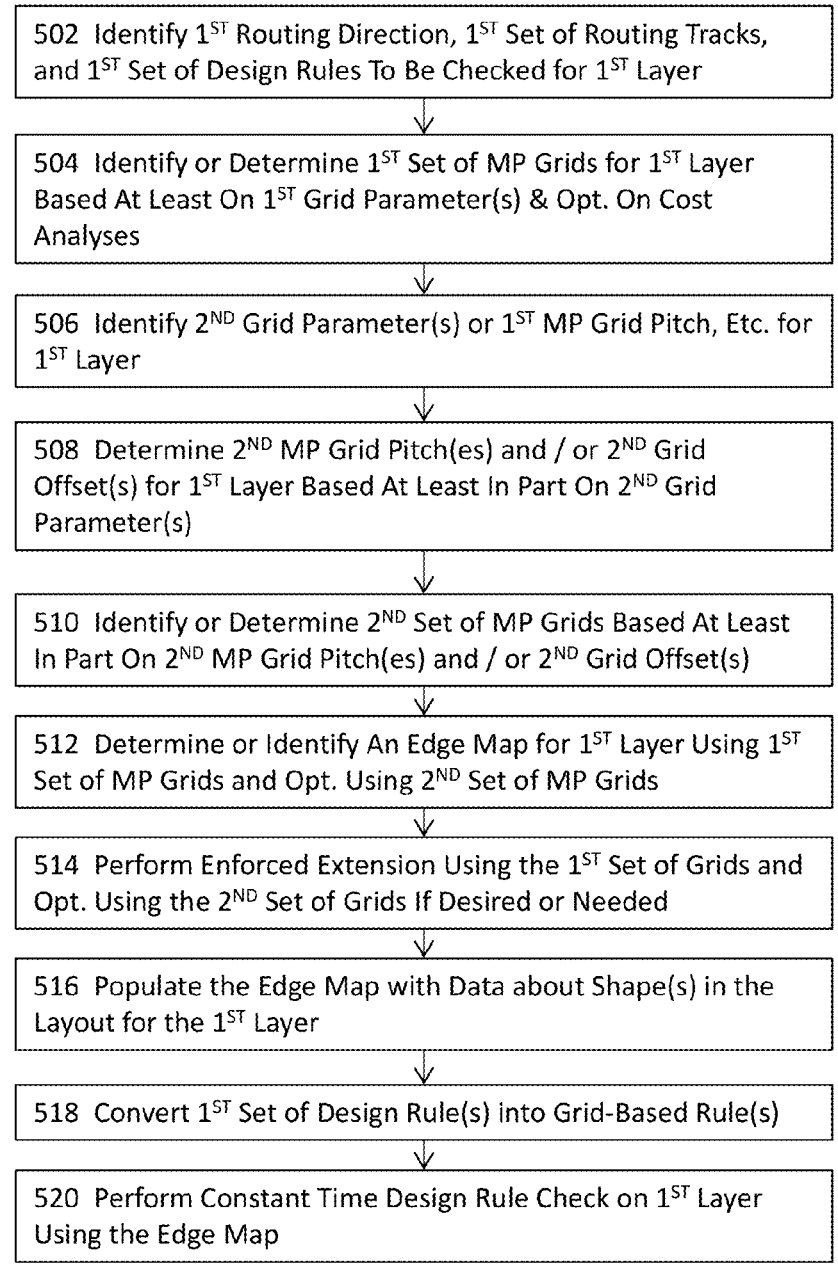
FIG. 5 illustrates a more detailed flow diagram for implementing multiple-patterning-aware correct-by-construction layout processing for an electronic design in some embodiments.

FIG. 5 illustrates a more detailed flow diagram for implementing multiple-patterning-aware correct-by-construction layout processing for an electronic design in some embodiments. In one or more embodiments, the method for implementing multiple-patterning-aware correct-by-construction layout processing for an electronic design illustrated in FIG. 5 may comprise the process 502 of Identify a first routing direction, a first set of routing tracks, and a first set of design rules to be checked for the first layer. In some embodiments, the method may include the process 504 of identifying or determining a first set of MP grids for the first layer based at least on one or more first grid parameters and optionally on results of cost analyses. In some embodiments, the one or more first grid parameters include, for example but not limited to, the grid pitch(es), grid offset(s), grid direction(s), or any combinations thereof, etc. for the first set of grids. In some embodiments, process 504 may identify or determine the first set of MP grids by using substantially similar processes described in the preceding paragraphs with reference to FIG. 2 and FIGS. 2A-D.

In some embodiments, the method may include the process 506 of identifying one or more second grid parameters for the second set of grids or one or more first grid parameters for the first set of grids, etc. for the first layer. In some embodiments, the one or more first grid parameters include, for example but not limited to, the grid pitch(es), grid offset(s), grid direction (s), or any combinations thereof, etc. for the second set of grids. In some embodiments where process 506 identifies one or more second grid parameters, the method may then uses these one or more second grid parameters to determine the second set of grids.

In some embodiments, the method may include the process 508 of determining the second grid pitch(es), the second grid offset(s), and/or the second grid direction(s) for the first layer based at least in part on the one or more second grid parameters or on the one or more first grid parameters. In some embodiments where process 506 identifies the parameters of the first set of grids, the process 508 may then infer or directly use the parameters of the first set of grids for the second set of grids. For example, the process 508 may use the first grid pitch of the first set of grids for the second set of grids. The process 508 may determine the second grid direction for the second set of grids from the first grid direction of the first set of grids.

In some embodiments, the method may include the process 510 of identifying or determining the second set of grids based at least in part on the second grid pitch(es) and optionally on the second grid offset(s).

In some embodiments, the method may include the process 512 of determining or identifying an edge map for the first layer using the set of grids and optionally using the second set of grids. In some embodiments, an edge map comprises a two-dimensional data structure to represent an abstraction of shapes on a layer. In these embodiments, the two-dimensional data structure includes the routing tracks, the set(s) of grids, each having a uniform pitch or non-uniform pitches. In some embodiments with horizontal routing tracks, every point in the edge map represents, high_line_end (a line-end terminating to the right of the originating point of the interconnect), low_line_end (a line-end terminating to the left of the originating point of the interconnect), through_wire, or blank. In some embodiments with vertical routing tracks, every point in the edge map represents, high_line_end (a line-end terminating above the originating point of the interconnect), low_line_end (a line-end terminating below the originating point of the interconnect), through_wire, or blank. In some embodiments, the processes described herein may identify an existing layout, which may be complete or incomplete, and convert the existing layout into an edge map by using the processes described herein. For example, these embodiments may identify the routing pitch(es) from the routed design components in the existing layout, determine the set(s) of grids based at least in part upon the routing pitch(es) and/or other rules, identify the line-ends of the interconnects, and place the identified line-ends in the edge map to generate the edge map.

One of the advantages of the edge map in physical design implementation is that the use of edge maps enables a constant time design rule checking and a constant time search for one or more shapes that violate a design rule, unlike other conventional approaches that search for shapes within a halo and performs comparison between the identified shapes and the rule and thus require the design rule checking time or a search time in an order (n) with regular design databases or order(log(n)) with a tree structure for the search, where n denotes the total number of shapes in a design. In other words, with the edge map data structure that stores the line ends, various DRC or search processes merely examines the edge map to determine the total number of line ends falling within a search radius or halo. Therefore, the search time and thus the check time are constant regardless of the number of shapes or design elements to be searched or checked. Another advantage of this constant time DRC and constant time search is that various embodiments described herein convert the multiple-exposure physical implementation problem (e.g., DRC or routing), which is global in nature, into a local problem.

In some embodiments, the method may include the process 514 of performing enforced extension using the first set of grids and optionally using the second set of grids if desired or needed. Enforced extension is described in the preceding paragraphs with reference to FIG. 4.

In some embodiments, the method may include the process 516 of populating the edge map with data for the shapes in the layout of the first layer. More details of the process 516 are described in subsequent paragraphs with reference to FIG. 6.

In some embodiments, the method may include the process 518 of converting the first set of design rule(s) to be checked into corresponding grid-based rules. For example, the trim mask minimum step rule 308B of FIG. 3B may require that two neighboring interconnects running in the same direction have a minimum step of 100-nm. If the grid pitch is 40-nm, the trim mask minimum step rule will be converted to a grid-based trim mask minimum width rule that requires at least three grids. Therefore, when checking the edge map to identify violations of this trim mask minimum step rule, the checking engine or the search engine merely has to examine the edge map to determine the total number of line points that fall within a +3 grids/−3 grids halo, and the search time is thus constant, independent of the total number of shapes or elements in the design.

In some embodiments, the method may include the process 520 of performing a constant time design rule check on the first layer using at least the edge map. The embodiments illustrated in FIG. 5 show a use model of various processes or module for implementing multiple-patterning-aware correct-by-construction layout processing for an electronic design as described in FIGS. 2, 2A-D, and 3-4. More details about the design rule check are described in U.S. patent application Ser. No. 13/840,567, entitled "METHODS, SYSTEMS, AND ARTICLES OF MANUFACTURE FOR IMPLEMENTING MULTIPLE-PATTERNING-AWARE DESIGN RULE CHECK FOR ELECTRONIC DESIGNS", the content of which is hereby incorporated by reference in its entirety for all purposes.

Figure 6:
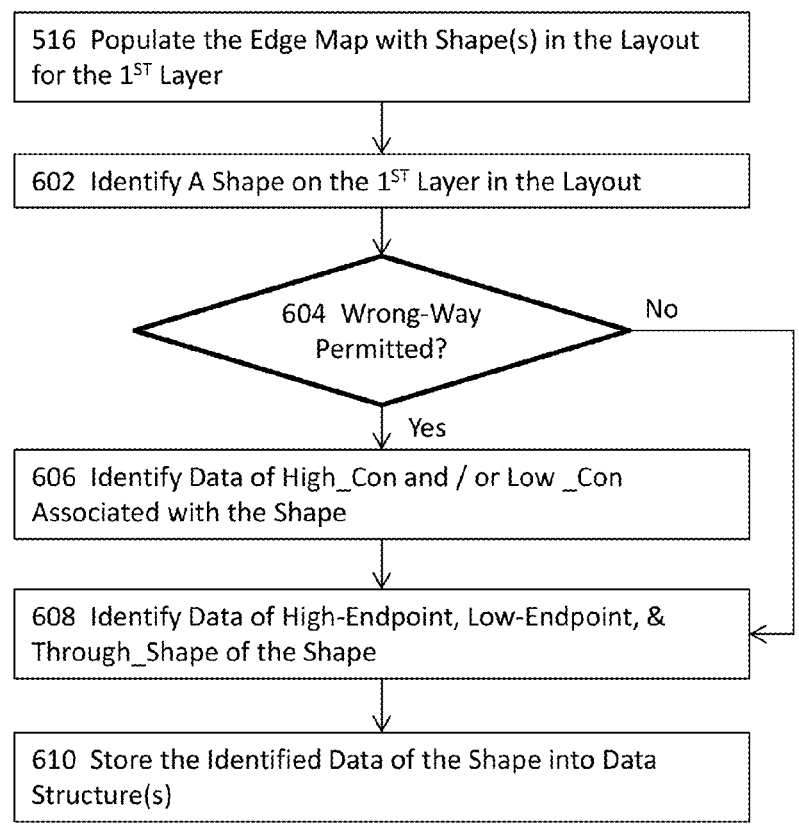
FIG. 6 illustrates more details about the flow diagram of FIG. 5 in some embodiments.

FIG. 6 illustrates more details about the flow diagram of FIG. 5 in some embodiments. More specifically, FIG. 6 illustrates more details about the process 516 of FIG. 5. In some embodiments, the process 516 may include the process 602 of identifying a shape (e.g., an interconnect) on the first layer in the layout.

In some embodiments, the process 516 may include the process 604 of determining whether or not wrong-way wires are permitted for the first layer. In some embodiments where only the right-way wires are permitted for the first layer, the process 516 proceeds to 608. Otherwise, the process 516 proceeds to 606.

In some embodiments, the process 516 may include the process 606 of identifying data of high_con and/or low_con associated with the shape. In some embodiments, the data structure described in 512 may be augmented to employ extra bits of low_con and high_con to represent wrong-way interconnects, in addition to the aforementioned high_line_end (a line-end terminating to the right of the originating point of the interconnect), low_line_end (a line-end terminating to the left of the originating point of the interconnect), through_wire, or blank in the edge map. In some embodiments, grids may also be set up with wrong way centerline(s) such that the enforced extension process as described above with reference to FIG. 4 may be minimized for wrong way wire. In some of these embodiments where grids are set up with wrong way centerline(s), right-way extension on wrong-way interconnect may be used such as the example shown in FIG. 7C. In some embodiments, the data identified at 606 may comprise coordinates for line ends. It shall be noted that the coordinates may be absolute or relative geometric coordinates or may be absolute or relative grids with respect to a preselected origin.

In some embodiments, the process 516 may include the process 608 of identifying data of high_line_end, low_line_end, through_wire (or through shape), and blank of the shape (e.g., an interconnect) in the corresponding data structure (e.g., an edge map).

In some embodiments, the process 516 may include the process 610 of storing the identified data of the shape to the data structure (e.g., an edge map).

Figure 7A:
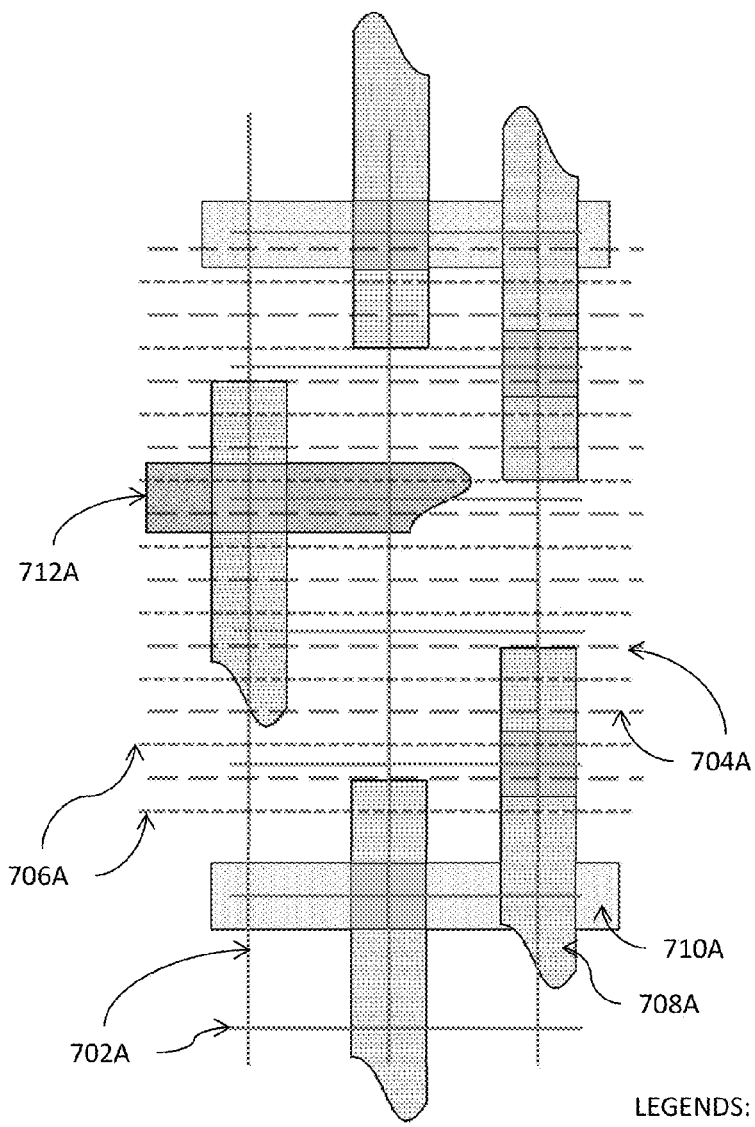
FIGS. 7A-C illustrate an exemplary implementation of the process illustrated in FIG. 4 in some embodiments.
Figure 7B:
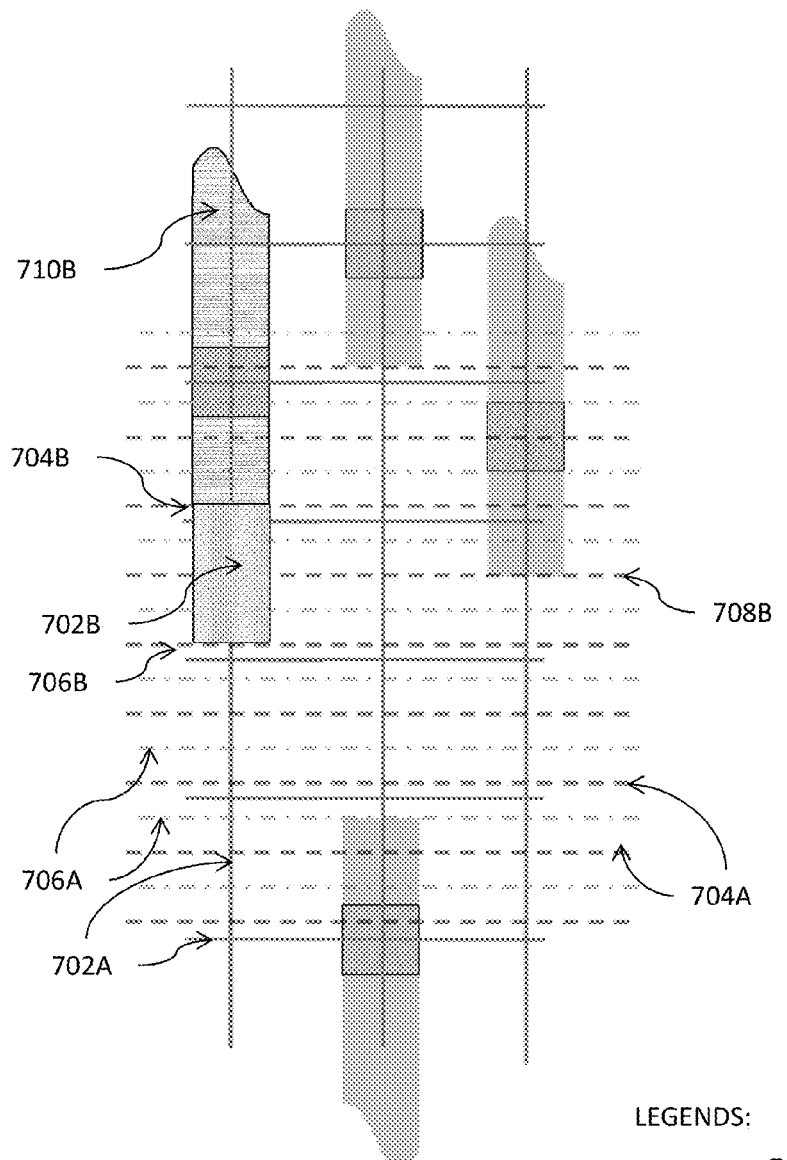
Figure 7C:
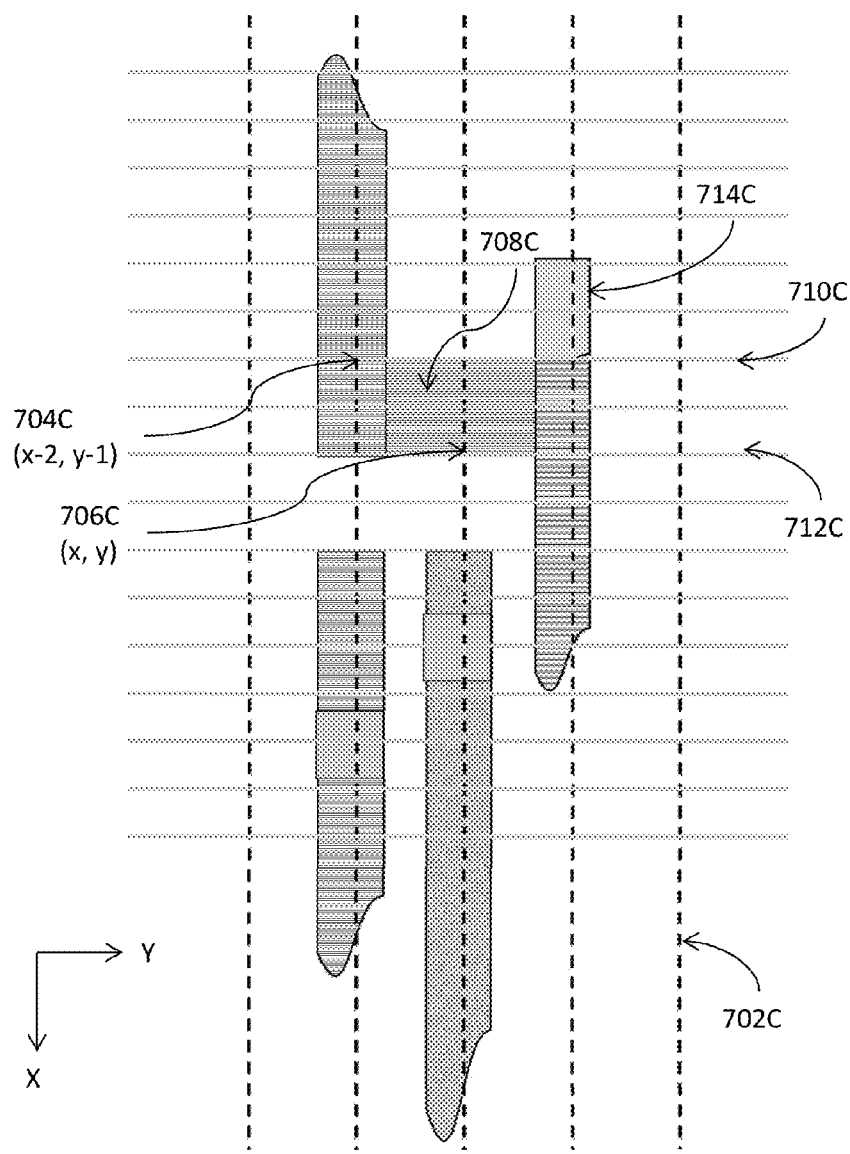

FIGS. 7A-C illustrate an exemplary implementation of the process illustrated in FIG. 4 in some embodiments. More specifically, FIG. 7A illustrates an working example of the processes described herein. In FIG. 7A, 702A denotes the routing tracks in the first direction and the second direction. 704A denotes the first set of grids (high grids) to which line ends running in the upward direction will be extended, and 706A denotes the second set of grids (low grids) to which line ends running in the downward direction will be extended. In this example, the direction of the low grids and the high grids is perpendicular to the routing direction of the routing tracks 702A. Moreover, 712A denotes the shapes (e.g., interconnects) in the third routing layer (M3); 708A denotes shapes in the second routing layer (M2); and 710A denotes the shapes (e.g., interconnects) in the first routing layer (M1). The intersections between shapes of different routing layers represent vias. To further illustrate various processes and data described herein, it is further assumed that M1 has a routing pitch of 100-nm; M2 has a routing pitch of 100-nm; and M3 has a routing pitch of 150-nm. The minimum cut enclosure is assumed to be 40-nm, and the cut size is assumed to be 50-nm. Following the description of various embodiments described herein, the edge map for the second routing layer (M2) may be associated with or store the routing pitch of 100-nm, which corresponds to the routing pitch of M2. The processes may determine the grid pitch for M2 to be 50-nm because 50-nm represents a common divisor (the great common divisor in this example) of the routing pitch 100-nm of M1 and the routing pitch 150-nm of M3. In some embodiments, the grid pitch may also be, for example, 25-nm or any common divisor of the two routing pitches of the two adjacent layers of M2. The processes described herein may also determine the grid offset to be half of the cut size (because the center of a via cut is placed along a routing track) plus the via enclosure rule (40-nm). In this example, the grid offset may be determined to be (50/2+40) or 65-nm. Therefore, the high grids may be offset from the routing tracks by 65-nm in the upward direction, and the low grids may be offset from the routing tracks by −65-nm, where the minus sign in the offset of the low grids indicates the offset is in the opposite direction of the high grids offset direction. In the example illustrated in FIG. 7A, no enforced extension is needed because all high_line_ends and low_line_ends fall on some grids.

FIG. 7B illustrates enforced extension of the low_line_end of a shape 710B (e.g., an interconnect) from the original position 704B to 706B with the enforced extension 702B representing an additional length added to the original shape 710B. In this example, various processes do not extend 710B to the closest low grid 708B but to the next closest grid 706B. This may be due to a violation of one or more design rules if the shape 710B were to be extended to 708B.

FIG. 7C illustrates an example of using an edge map to represent wrong-way interconnects. More specifically, assuming the preferred routing direction is the X-direction as shown by the routing tracks 702C. The shape (e.g., interconnect) 708C thus represents a wrong-way interconnect because 708C is appears to be routed in the Y-direction. In this example, some embodiments may employ extra bits of low_con and high_con to represent the wrong-way interconnect 708C. Also, grids may also be set up in such a way that the enforced extension (between 710C and 712C) is minimized for the wrong-way interconnect 712C. As it can be seen in FIG. 7C, the coarser the grids are, the longer (in the X-direction) the wrong-way interconnect will be. Also, although wrong-way interconnect 708C appears to be routed in the Y-direction, various processes treat the wrong-way interconnect 708C as if it were a right-way interconnect and thus ensure that the line-ends of 708C are extended to the appropriate grids (710C and 712C) while using the low_con and high_con extra bits to indicate that 708C is a wrong-way interconnect. 704C denotes a through-wire at (x-2, y-1), and 706C denotes a line_end with both low_con and high_con at (x, y) to cover the span of the wrong-way interconnect. Moreover, 714C shows that right-way extension on wrong-way interconnect may also be accommodated by some embodiments.

System Architecture Overview

Figure 8:
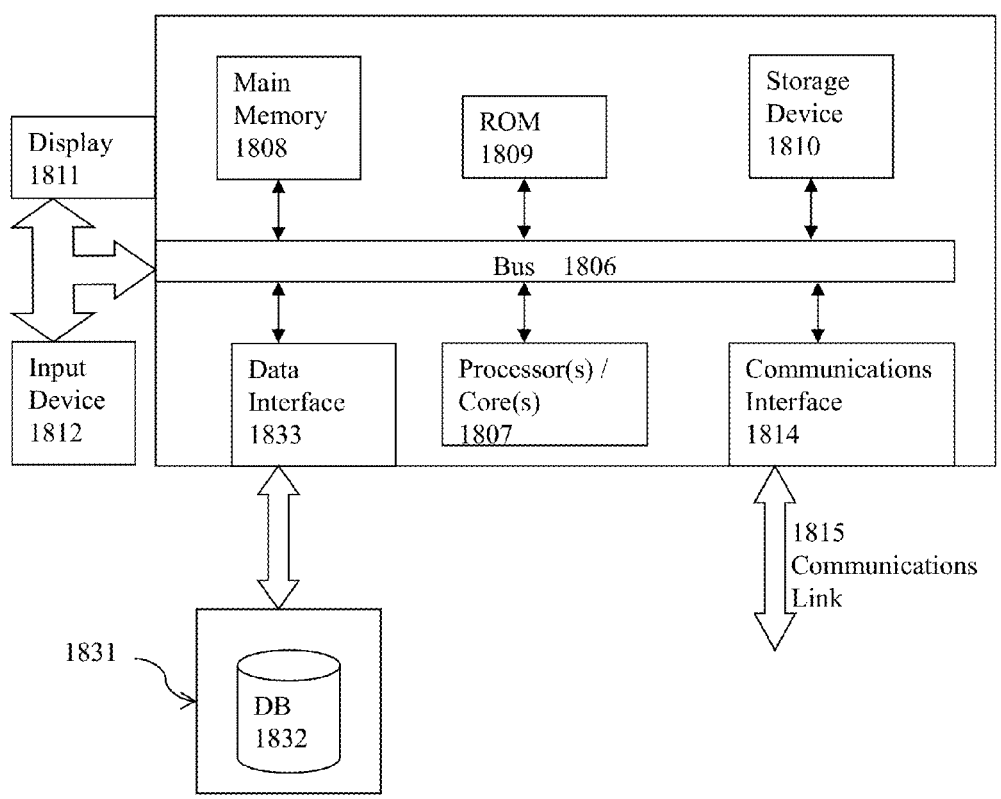
FIG. 8 illustrates a block diagram of an illustrative computing system 1400 suitable for implementing various embodiments described herein.

FIG. 8 illustrates a block diagram of an illustrative computing system 1800 suitable for implementing various embodiments described herein. For example, the exemplary computing system 1800 may be used to implement various processes as described in the preceding paragraphs and the figures such as various processes or modules of such as various cost analysis processes or modules, various other determining processes or modules, various processes or modules for performing various actions, etc. as described in the remainder of the Application. Computer system 1800 includes a bus 1806 or other communication mechanism for communicating information, which interconnects subsystems and devices, such as processor 1807, system memory 1808 (e.g., RAM), static storage device 1809 (e.g., ROM), disk drive 1810 (e.g., magnetic or optical), communication interface 1814 (e.g., modem or Ethernet card), display 1811 (e.g., CRT or LCD), input device 1812 (e.g., keyboard), and cursor control (not shown).

According to one embodiment of the invention, computer system 1800 performs specific operations by one or more processors or processor cores 1807 executing one or more sequences of one or more instructions contained in system memory 1808. Such instructions may be read into system memory 1808 from another computer readable/usable storage medium, such as static storage device 1809 or disk drive 1810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 1807 may be used to perform various actions such as various actions, processes, or modules involving determining, analyzing, performing actions, etc. In some embodiments, at least one of the one or more processors or processor cores 1807 has the multithreading capability.

In one embodiment, the term "logic" shall mean any combination of software or hardware that is used to implement all or part of the invention. In the single embodiment or in some embodiments, the one or more processors or processor cores 1807 may be used to perform various acts such as various acts involving determining, analyzing, performing actions, etc. In some embodiments, at least one of the one or more processors or processor cores 1807 has the multithreading capability to execute a plurality of threads to perform various tasks as described in the preceding sections.

Various actions as described in the preceding paragraphs may be performed by using one or more processors, one or more processor cores, or combination thereof 1807. For example, various processes or modules involving the determining action, various analysis processes or modules, etc. may be performed by one or more processors, one or more processor cores, or combination thereof.

The term "computer readable storage medium" or "computer usable storage medium" as used herein refers to any non-transitory medium that participates in providing instructions to processor 1807 for execution. Such a medium may take many forms, including but not limited to, non-volatile media and volatile media. Non-volatile media includes, for example, optical or magnetic disks, such as disk drive 1810. Volatile media includes dynamic memory, such as system memory 1808.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), a magnetic tape, any other magnetic or a magneto-optical medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the one or more master regions, one or more master output layers, one or more global scratch layers, various transforms and inverse transforms, shapes, etc.

In an embodiment of the invention, execution of the sequences of instructions to practice the invention is performed by a single computer system 1800. According to other embodiments of the invention, two or more computer systems 1800 coupled by communication link 1815 (e.g., LAN, PTSN, or wireless network) may perform the sequence of instructions required to practice the invention in coordination with one another.

Computer system 1800 may transmit and receive messages, data, and instructions, including program, i.e., application code, through communication link 1815 and communication interface 1814. Received program code may be executed by processor 1807 as it is received, and/or stored in disk drive 1810, or other non-volatile storage for later execution. In an embodiment, the computer system 1800 operates in conjunction with a data storage system 1831, e.g., a data storage system 1831 that contains a database 1832 that is readily accessible by the computer system 1800. The computer system 1800 communicates with the data storage system 1831 through a data interface 1836. A data interface 1836, which is coupled to the bus 1806, transmits and receives electrical, electromagnetic or optical signals that include data streams representing various types of signal information, e.g., instructions, messages and data. In embodiments of the invention, the functions of the data interface 1836 may be performed by the communication interface 1814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method for implementing multiple-patterning-aware correct-by-construction layout processing for an electronic design, comprising:
at least one processor performing a process, the process comprising:
identifying a first layer and one or more second rules for one or more second layers in the electronic design;
determining or identifying a first set of grids for implementing or converting a design for the first layer based at least in part upon the one or more second rules for the one or more second layers; and
generating a data structure to store the design for the first layer using at least the first set of grids.

2. The computer implemented method of claim 1, in which the one or more second rules comprise one or more second routing pitches for at least one second layer of the one or more second layers, one or more routing directions for the at least one second layer, a via cut size rule, or a via enclosure rule for the one or more second layers.

3. The computer implemented method of claim 1, in which the act of determining or identifying the first set of grids comprises determining one or more grid pitches based at least in part upon the one or more second rules.

4. The computer implemented method of claim 1, in which the act of determining or identifying the first set of grids comprises determining one or more grid offsets based at least in part upon the one or more second rules.

5. The computer implemented method of claim 1, in which the one or more second layers are adjacent to the first layer.

6. The computer implemented method of claim 1, the process further comprising:
identifying one or more first rules for the first layer of the electronic design; and
generating or identifying the first set of grids based further at least in part upon the one or more first rules for the first layer.

7. The computer implemented method of claim 6, in which the one or more first rules comprise one or more first routing pitches, one or more routing directions, a via cut size rule, or a via enclosure rule for the first layer.

8. The computer implemented method of claim 7, in which the act of determining or identifying the first set of grids comprises:
determining one or more grid directions, each of which corresponds to a corresponding first routing direction of the one or more routing directions.

9. The computer implemented method of claim 1, in which the process further comprises:
determining or identifying a second set of grids for implementing or converting the design for the first layer based at least in part upon the first set of grids and the one or more second rules for the second layer.

10. The computer implemented method of claim 9, in which the process further comprises:
determining one or more grid pitches for the second set of grids based at least in part upon the one or more second rules and the first set of grids; and
determining one or more grid offsets for the first set of grids based at least in part upon the one or more second rules and the first set of grids.

11. The computer implemented method of claim 1, in which the process further comprises:
performing enforced extensions on a geometric shape in the first layer.

12. The computer implemented method of claim 11, in which the act of performing the enforced extensions comprises:
identifying available sets of grids for the first layer;
identifying the geometric shape in the first layer; and
identifying a direction or orientation of the geometric shape relative to an originating location of the geometric shape.

13. The computer implemented method of claim 12, in which the act of performing the enforced extensions comprises:
identifying an end of the geometric shape based at least in part upon the direction or orientation of the geometric shape;
identifying or determining a first grid in the available sets of grids for the first layer; and
extending the end of the geometric shape to the first grid.

14. The computer implemented method of claim 1, in which the process further comprises:
populating the data structure with data of ends of design elements in the first layer.

15. The computer implemented method of claim 14, in which the process further comprises:
determining whether wrong-way interconnects are permitted in the first layer;
representing a grid point with grid point data including high_line_end, low_line_end, through_wire, or blank data; and
augmenting the grid point data of a first grid point to include high_con and low_con data.

16. The computer implemented method of claim 1, in which the design implemented or converted using at least the first set of grids automatically satisfies a plurality of trim mask design rules for multiple exposure lithography.

17. An article of manufacture comprising a non-transitory computer readable storage medium storing thereupon a sequence of instructions which, when executed by at least one processor or at least one processor core, causes the at least one processor or the at least one processor core to perform a method for multiple-patterning-aware correct-by-construction layout processing for an electronic design, the method comprising:
at least one processor performing a process, the process comprising:
identifying a first layer and one or more second rules for one or more second layers in the electronic design;
determining or identifying a first set of grids for implementing or converting a design for the first layer based at least in part upon the one or more second rules for the one or more second layers; and
generating a data structure to store the design for the first layer using at least the first set of grids.

18. The article of manufacture of claim 17, in which the act of determining or identifying the first set of grids comprises:
determining one or more grid pitches based at least in part upon the one or more second rules; and
determining one or more grid offsets based at least in part upon the one or more second rules.

19. The article of manufacture of claim 17, the process further comprising:
identifying one or more first rules for the first layer of the electronic design; and
generating or identifying the first set of grids based further at least in part upon the one or more first rules for the first layer, in which the one or more first rules comprise one or more first routing pitches, one or more routing directions, a via cut size rule, or a via enclosure rule for the first layer.

20. The article of manufacture of claim 19, in which the act of determining or identifying the first set of grids comprises:
determining one or more grid directions, each of which corresponds to a corresponding first routing direction of the one or more routing directions.

21. The article of manufacture of claim 17, in which the process further comprises:
determining or identifying a second set of grids for implementing or converting the design for the first layer based at least in part upon the first set of grids and the one or more second rules for the second layer;
determining one or more grid pitches for the second set of grids based at least in part upon the one or more second rules and the first set of grids; and
determining one or more grid offsets for the first set of grids based at least in part upon the one or more second rules and the first set of grids.

22. The article of manufacture of claim 17, in which the process further comprises:
performing enforced extensions on a geometric shape in the first layer;
identifying available sets of grids for the first layer;
identifying the geometric shape in the first layer; and
identifying a direction or orientation of the geometric shape relative to an originating location of the geometric shape.

23. The article of manufacture of claim 22, in which the act of performing the enforced extensions comprises:
identifying an end of the geometric shape based at least in part upon the direction or orientation of the geometric shape;
identifying or determining a first grid in the available sets of grids for the first layer; and
extending the end of the geometric shape to the first grid.

24. The article of manufacture of claim 23, in which the process further comprises:
determining whether wrong-way interconnects are permitted in the first layer;
representing a grid point with grid point data including high_line_end, low_line_end, through_wire, or blank data;
augmenting the grid point data of a first grid point to include high_con and low_con data; and
populating the data structure with the grid point data of the first layer.

25. A system for implementing multiple-patterning-aware correct-by-construction layout processing for an electronic design, comprising:
a computing system that comprises at least one processor having at least one core and is to:
identify a first layer and one or more second rules for one or more second layers in the electronic design;
determine or identify a first set of grids for implementing or converting a design for the first layer based at least in part upon the one or more second rules for the one or more second layers; and
generate a data structure to store the design for the first layer using at least the first set of grids.

26. The system of claim 25, in which the computing system that is to determine or identify the first set of grids is further to:
determine one or more grid pitches based at least in part upon the one or more second rules; and
determine one or more grid offsets based at least in part upon the one or more second rules.

27. The system of claim 25, the computing system is further to:
identify one or more first rules for the first layer of the electronic design; and
generate or identify the first set of grids based further at least in part upon the one or more first rules for the first layer, in which the one or more first rules comprise one or more first routing pitches, one or more routing directions, a via cut size rule, or a via enclosure rule for the first layer.

28. The system of claim 27, in which the computing system that is to determine or identify the first set of grids is further to:
determine one or more grid directions, each of which corresponds to a corresponding first routing direction of the one or more routing directions.

29. The system of claim 25, in which the computing system that is to determine or identify the first set of grids is further to:
determine or identify a second set of grids for implementing or converting the design for the first layer based at least in part upon the first set of grids and the one or more second rules for the second layer;
determine one or more grid pitches for the second set of grids based at least in part upon the one or more second rules and the first set of grids; and
determine one or more grid offsets for the first set of grids based at least in part upon the one or more second rules and the first set of grids.

30. The system of claim 25, in which the computing system is further to:
perform enforced extensions on a geometric shape in the first layer;
identify available sets of grids for the first layer;
identify the geometric shape in the first layer; and
identify a direction or orientation of the geometric shape relative to an originating location of the geometric shape.

31. The system of claim 30, in which the computing system that is to perform the enforced extensions is further to:
- identify an end of the geometric shape based at least in part upon the direction or orientation of the geometric shape;
- identify or determine a first grid in the available sets of grids for the first layer; and
- extend the end of the geometric shape to the first grid.

32. The system of claim 31, in which the computing system is further to:
- determine whether wrong-way interconnects are permitted in the first layer;
- represent a grid point with grid point data including high_line_end, low_line_end, through_wire, or blank data;
- augment the grid point data of a first grid point to include high_con and low_con data; and
- populate the data structure with the grid point data of the first layer.

* * * * *